United States Patent
Srivastava et al.

(10) Patent No.: US 9,042,064 B2
(45) Date of Patent: May 26, 2015

(54) ELECTROSTATIC DISCHARGE PROTECTION FOR CLASS D POWER AMPLIFIERS

(71) Applicant: QUALCOMM Incorporated, San Diego, CA (US)

(72) Inventors: Ankit Srivastava, San Diego, CA (US); Eugene R Worley, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 196 days.

(21) Appl. No.: 13/645,223

(22) Filed: Oct. 4, 2012

(65) Prior Publication Data

US 2014/0098447 A1    Apr. 10, 2014

(51) Int. Cl.
*H02H 9/04*      (2006.01)
*H01L 27/02*     (2006.01)

(52) U.S. Cl.
CPC ........... *H01L 27/0285* (2013.01); *H02H 9/046* (2013.01)

(58) Field of Classification Search
USPC .......................................................... 361/56
See application file for complete search history.

(56) References Cited

U.S. PATENT DOCUMENTS

| | | | |
|---|---|---|---|
| 8,072,722 B1 | 12/2011 | Hwang | |
| 8,077,440 B2 | 12/2011 | Krabbenborg et al. | |
| 2004/0141267 A1 | 7/2004 | Khazhinsky et al. | |
| 2009/0195946 A1* | 8/2009 | Kleveland | 361/56 |
| 2010/0067155 A1* | 3/2010 | Gallerano et al. | 361/56 |
| 2010/0157493 A1 | 6/2010 | Guedon et al. | |
| 2011/0176245 A1 | 7/2011 | Worley et al. | |
| 2011/0194219 A1* | 8/2011 | Tailliet | 361/56 |
| 2011/0267723 A1 | 11/2011 | Stockinger et al. | |
| 2011/0279935 A1 | 11/2011 | Iwasa et al. | |
| 2012/0170161 A1* | 7/2012 | Lin et al. | 361/56 |
| 2012/0236444 A1 | 9/2012 | Srivastava et al. | |
| 2014/0177113 A1* | 6/2014 | Gueorguiev et al. | 361/56 |
| 2014/0251051 A1* | 9/2014 | Yamada | 74/473.12 |

FOREIGN PATENT DOCUMENTS

EP        2355152 A1    8/2011

OTHER PUBLICATIONS

International Search Report and Written Opinion—PCT/US2013/063589—ISA/EPO—Jan. 30, 2014.

(Continued)

*Primary Examiner* — Thienvu Tran
*Assistant Examiner* — Angela Brooks
(74) *Attorney, Agent, or Firm* — Ramin Mobarhan

(57) ABSTRACT

Electrostatic discharge protection for Class D power amplifiers is disclosed. In an exemplary embodiment, an apparatus includes an amplifier having an output transistor coupled to an interface pad, a snapback supply clamp coupled across first and second supplies of the amplifier and configured to provide a clamp voltage across the first and second supplies during ESD event; and a trigger circuit coupled to the output transistor, the trigger circuit configured to detect the clamp voltage and to enable the output transistor to provide a discharge path from the interface pad to the second supply when the clamp voltage is detected.

20 Claims, 5 Drawing Sheets

(56) References Cited

OTHER PUBLICATIONS

Serneels B. et al., "A 1.5W 10V-output Class-D amplifier using a boosted supply from a single 3.3V input in standard 1.8V/3.3V 0.18 m CMOS", IEEE International Solid-State Circuits Conference Digest of Technical Papers (ISSCC), Feb. 19, 2012, IEEE, pp. 94-96, XP032154364, DOI: 10.1109/ISSCC.2012.6176890, ISBN: 978-1-4673-0376-7.

* cited by examiner

US 9,042,064 B2

ELECTROSTATIC DISCHARGE PROTECTION FOR CLASS D POWER AMPLIFIERS

BACKGROUND

1. Field

The present application relates generally to the operation and design of power amplifiers, and more particularly, to the operation and design of electrostatic discharge protection for power amplifier integrated circuits.

2. Background

A Class D Power Amplifier (PA) integrated circuit (IC) can be used in a device to drive an off-chip audio speaker. Typically, such a device needs to provide electrostatic discharge (ESD) protection in accordance with industry standards, such as standards developed by the International Electrotechnical Commission (IEC). One such standard, referred to as "IEC 61000-4-2" requires system level protection of 8KV contact and 15KV air discharge. This standard requires a system to have the capability to sink close to 20 amps of peak current during an IEC ESD event. In contrast, a less rigorous standard, referred to "Human Body Model" (HBM) requires only 2KV of protection which translates to 1.3 amps of peak currents. The HBM is a standard for component level ESD testing while IEC 61000-4-2 is a standard for system level ESD testing. A Class D PA used in real applications needs to satisfy both HBM and IEC standards.

In one implementation, the Class D PA IC may provide two interface pins that are used to output audio signals and two interface pins that are used to receive voltage sensing signals. Thus, the Class D PA IC may have four or more interface pins that require ESD protection for both HBM and IEC discharge events.

Typically, external transient voltage suppression (TVS) diodes are used to provide ESD protection for integrated circuits. However, TVS diodes are expensive and may lead to excessive bill of material (BOM) costs depending on the number of IC interface pins that require ESD protection.

Accordingly, it would be desirable to have a simple and low cost mechanism to provide ESD protection for interface pins of a Class D PA against HBM and IEC discharge events.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
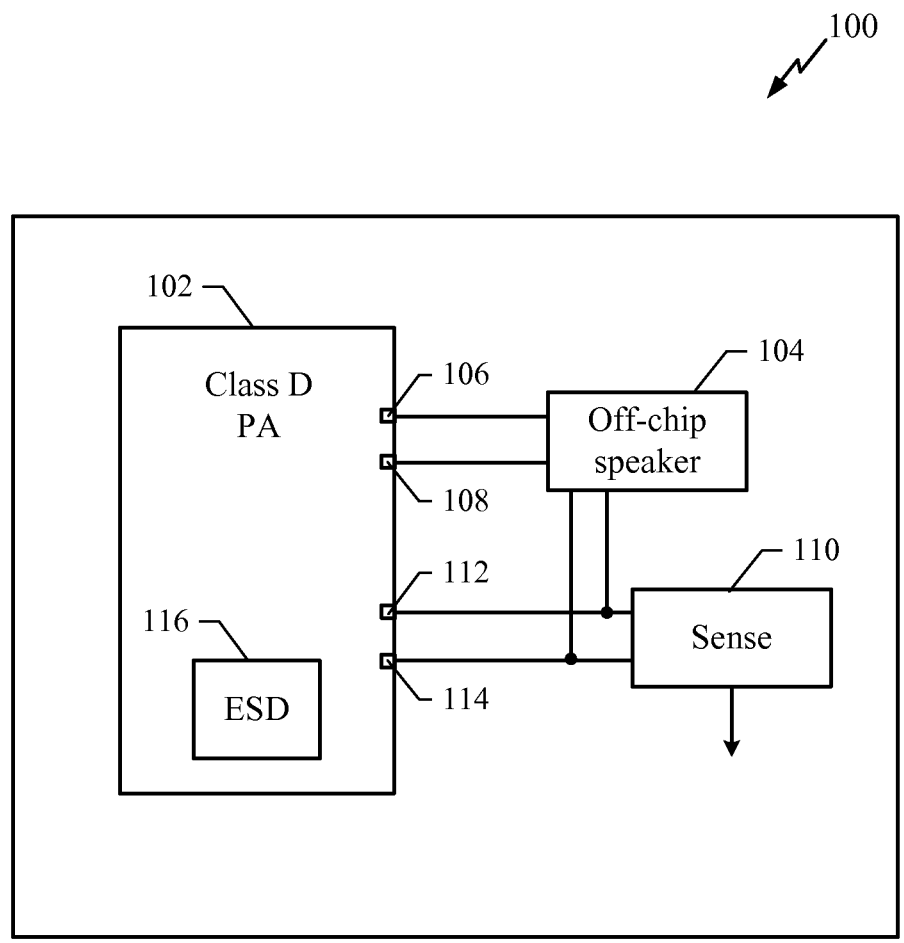
FIG. 1 shows a device having an exemplary embodiment of an integrated Class D power amplifier with on-chip ESD protection.

FIG. 1 shows a device 100 having an exemplary embodiment of an integrated Class D power amplifier 102 with on-chip ESD protection 116. For example, the device 100 may be a portable audio device, such as a portable telephone or MP3 player. The integrated Class D PA 102 has interface pins 106 and 108 to output audio signals to drive an off-chip speaker 104. A sense circuit 110 is coupled to the audio speaker 104 to receive sense signals indicating overload conditions and to output an indication of the overload conditions to other entities at the device 100. The sense signals are also input to the PA 102 using interface pins 112 and 114.

The on-chip ESD protection circuit 116 operates to protect the interface pins 106, 108, 112, and 114 from ESD associated with both HBM and IEC discharge events. For example the protection circuit 116 operates to provide ESD protection against a contact event of up to 8KV and/or an air discharge event of up to 15KV. Since the ESD protection circuit 116 is integrated with the Class D PA 102, the need for off-chip ESD protection devices, such as TVS diodes, is eliminated thereby saving costs. Furthermore, the ESD protection circuit 116 is configured to handle large ESD events with a minimum silicon area which again saves cost.

Figure 2:
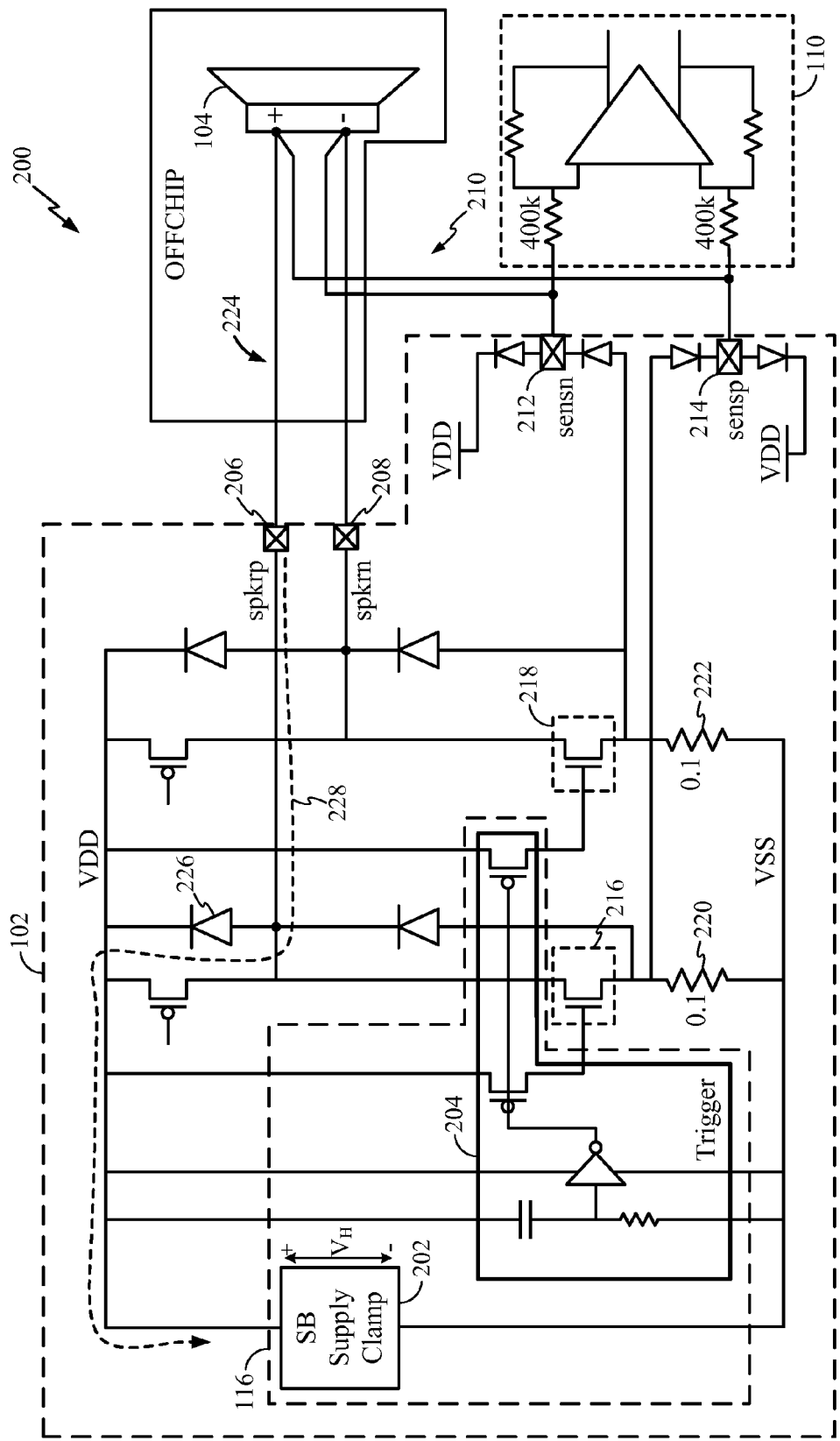
FIG. 2 shows an exemplary detailed view of the Class D power amplifier shown in FIG. 1.

FIG. 2 shows an exemplary detailed view 200 of the Class D power amplifier 102 shown in FIG. 1. In an exemplary embodiment, the PA 102 is provided on an integrated circuit. The PA 102 comprises the ESD protection circuit 116 that is also integrated on the same circuit. The ESD protection circuit 116 includes a snapback (SB) supply clamp 202 and trigger circuit 204. The ESD protection circuit 116 is configured to provide ESD protection to interface pins (or pads) 206 and 208 that are coupled to the off-chip speaker 104 using speaker signal lines 224. The PA 102 is also configured to provide ESD protection to interface pads 212 and 214 that receive sense inputs using sense lines 210.

As illustrated in FIG. 2, the SB supply clamp 202 is connected across first and second supplies of the PA 102. For example, the first supply is a VDD supply and the second supply is a VSS supply. Thus, the SB supply clamp 202 is connected across the VDD and VSS supply rails of the PA 102. The SB supply clamp 202 comprises any suitable supply clamp that provides excellent current conduction capability and a fast turn-on time to discharge ESD events. During operation, should the SB supply clamp 202 activate in response to an ESD discharge event, the SB supply clamp 202 maintains a holding voltage ($V_H$) and provides a clamp voltage across the VDD and VSS supply rails to protect the PA 102.

The trigger circuit 204 is also coupled between the VDD and VSS supply rails of the PA 102. The trigger circuit 204 operates to detect the clamp voltage that occurs as the result of an ESD discharge event and to activate NMOS output transistors 216 and 218 to provide a discharge path to the VSS supply rail in response. In an exemplary embodiment, the trigger circuit 204 detects the ESD discharge event by sensing the clamp voltage associated with the VDD supply rail. For example, in response to an ESD discharge event at the interface pad 206, a large current flows along path 228 through the diode 226 to the VDD supply rail. The ESD event would result in activating the SB supply clamp 202 to maintain the holding voltage ($V_H$) and to provide a clamp voltage across the VDD and VSS supply rails. The trigger circuit 204 detects the clamp voltage on the VDD supply rail in response to the ESD discharge event and activates the output transistors 216 and 218 to provide a discharge path through the resistors 220 and 222 to the VSS supply rail. A more detailed description of the operation of the ESD protection circuit 116 is provided below with reference to FIG. 3.

Figure 3:
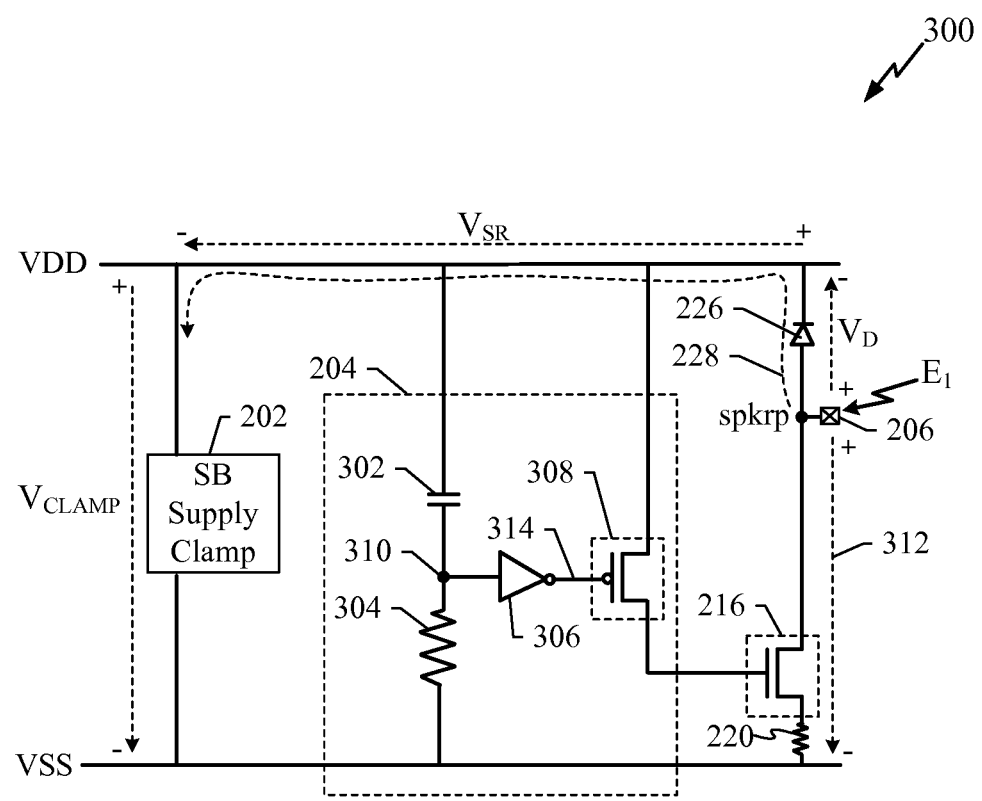
FIG. 3 shows a detailed exemplary embodiment of a selected portion of an ESD protection circuit.

FIG. 3 shows a detailed exemplary embodiment of a selected portion 300 of the PA 200 shown in FIG. 2. For clarity, the portion 300 includes only one NMOS output transistor; however the circuit is easily extended to include both NMOS output transistors. The portion 300 includes the snapback supply clamp 202 and the trigger circuit 204 that are connected across the VDD and VSS supply rails.

The trigger circuit 204 comprises capacitor 302 connected between the VDD supply rail and resistor 304. The resistor 304 is connected between the capacitor 302 and the VSS supply rail. An inverter 306 has its input connected to both the capacitor 302 and the resistor 304 at terminal 310. An output of the inverter 306 is connected to a gate terminal of a trigger transistor 308. The trigger transistor 308 has a source terminal connected to the VDD supply rail. The drain terminal of the trigger transistor 308 is connected to the gate terminal of the NMOS output transistor 216.

During operation, an ESD event ($E_1$) may occur at the interface pad 206. The event $E_1$ may be an IEC discharge event that results in a large current flowing along the path 228 and causes the SB supply clamp 202 to maintain the holding voltage ($V_H$). The voltage level generated at the pad 206 ($V_{PAD}$) can be determined from a combination of the voltage ($V_D$) across the diode 226, the voltage ($V_{SR}$) along the VDD supply rail, and the clamp voltage ($V_{CLAMP}$) across the supply clamp 202. The clamp voltage $V_{CLAMP}$ is a combination of the holding voltage ($V_H$) plus the voltage associated with the on-resistance of the supply clamp 202. Assuming a discharge current of approximately (20 amps), a diode on-resistance of approximately (0.05 ohm), a VDD supply rail resistance of approximately (0.05 ohm), a holding voltage ($V_H$) of 6 volts, and a supply clamp 202 on-resistance of approximately (0.1); the pad voltage ($V_{PAD}$) can be approximated from the following expression.

$$V_{PAD} = V_D + V_{SR} + V_{CLAMP}$$

$$V_{PAD} \sim (0.7 + (20*0.05)) + (20*0.05) + (6 + (0.1*20))$$

$$V_{PAD} \sim 10.7 \text{ volts}$$

In response to the ESD event ($E_1$), the node 310 experiences an increased voltage associated with the activation of the supply clamp 202 providing the clamp voltage. The voltage at node 310 causes the inverter 306 to output a trigger signal 314 that turns on trigger transistor 308. The turned-on trigger transistor 308 activates the NMOS output transistor 216, which provide a conduction path 312 to discharge the ESD event ($E_1$) to VSS through the resistor 220, which has a resistance value of approximately (0.1 ohms).

MOS Conduction Mode

In an exemplary embodiment, the NMOS output transistor 216 is implemented as a BigFET to limit pad voltage at the interface pad 206, and to provide the additional discharge path 312 to VSS. A BigFET is a NMOS transistor configured with a large channel width that operates in a MOS conduction mode to provide a discharge path sufficient to discharge IEC and HBM ESD events. A more detailed description of the MOS conduction mode is provided below.

Figure 4:
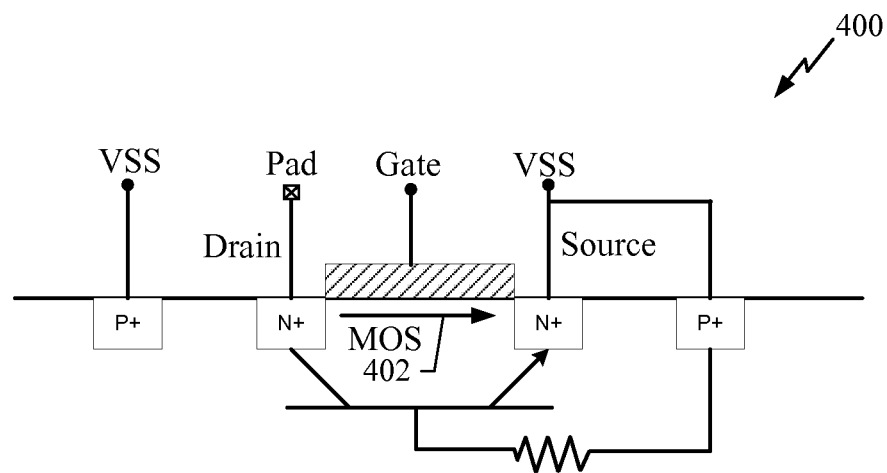
FIG. 4 shows an exemplary diagram of a NMOS transistor implemented as a BigFET and operating in a MOS conduction mode.

FIG. 4 shows an exemplary detailed diagram 400 of the NMOS transistor 216 implemented or configured as a BigFET operating in a MOS conduction mode. In an exemplary embodiment, a MOS conduction path 402 is provided by the BigFET which operates to provide a large discharge path.

Figure 5:
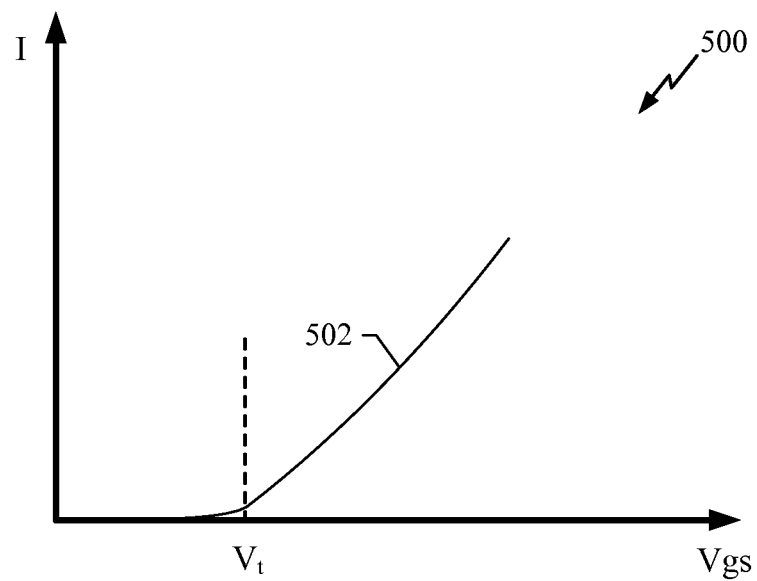
FIG. 5 shows an exemplary graph that illustrates a current-voltage relationship of the NMOS transistor shown in FIG. 4 when operating in the MOS conduction mode.

FIG. 5 shows an exemplary graph 500 that illustrates a current-voltage relationship of the NMOS transistor 216 shown in FIG. 4 when operating in MOS conduction mode. The graph 500 shows pad current (I) on the vertical axis and transistor gate-source voltage ($V_{GS}$) on the horizontal axis. As illustrated by plot line 502, after the $V_{GS}$ voltage exceeds a threshold ($V_t$) there is generally a linear current-voltage relationship thereafter.

Figure 6:
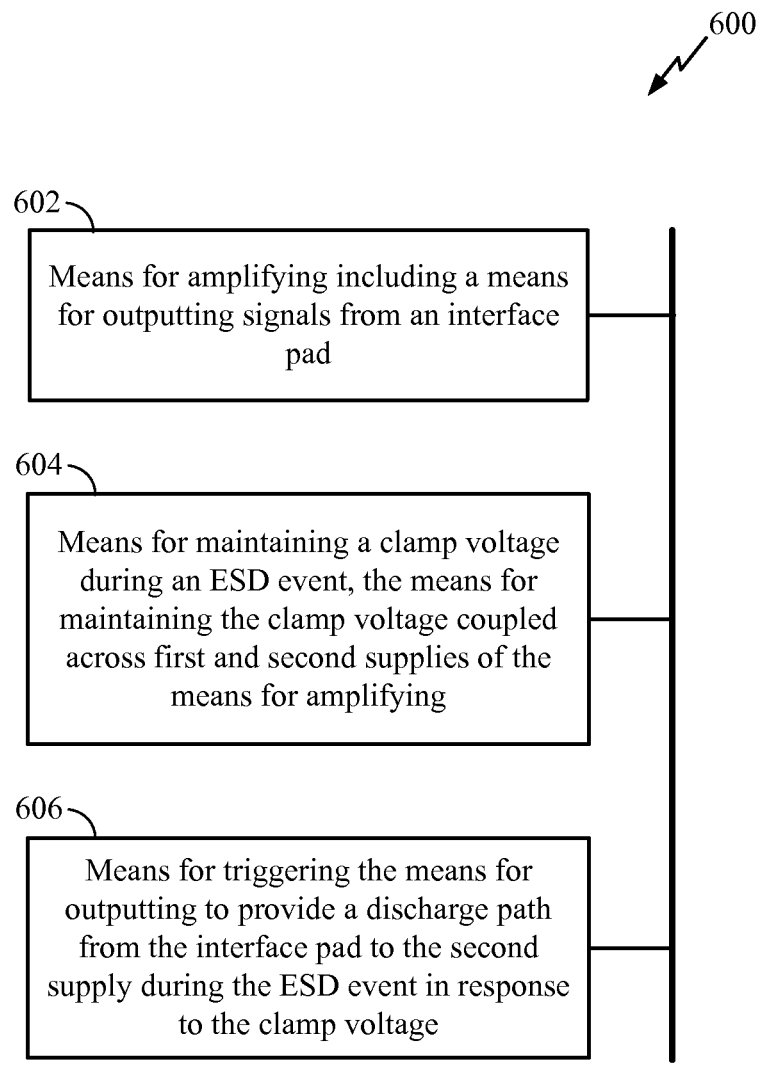
FIG. 6 shows an exemplary embodiment of a Class D power amplifier apparatus having integrated ESD protection.

FIG. 6 shows an exemplary embodiment of a Class D power amplifier apparatus 600 having integrated ESD protection. For example, the apparatus 600 is suitable for use as the Class D PA 102 shown in FIG. 2. In an aspect, the apparatus 600 is implemented by one or more modules configured to provide the functions as described herein. For example, in an aspect, each module comprises hardware and/or hardware executing software.

The apparatus 600 comprises a first module comprising means (602) for amplifying including a means for outputting signals from an interface pad, which in an aspect comprises NMOS output transistors 216 and 218.

The apparatus 600 also comprises a second module comprising means (604) for maintaining a clamp voltage during an ESD event, the means for maintaining the clamp voltage coupled across first and second supplies of the means for amplifying, which in an aspect comprises snapback supply clamp 202.

The apparatus 600 also comprises a third module comprising means (606) for triggering the means for outputting to provide a discharge path from the interface pad to the second supply during the ESD event in response to the clamp voltage, which in an aspect comprises trigger circuit 204.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus, comprising:
   an amplifier that includes an output transistor configured to output an amplified signal at an output that is coupled to an interface pad;
   a snapback supply clamp coupled across first and second supplies of the amplifier and configured to provide a clamp voltage across the first and second supplies during an electrostatic discharge (ESD) event; and
   a trigger circuit coupled to the output transistor, the trigger circuit configured to detect the clamp voltage and to enable the output transistor to provide a discharge path from the interface pad to the second supply when the clamp voltage is detected.

2. The apparatus of claim 1, the amplifier comprises a Class D power amplifier.

3. The apparatus of claim 1, the output transistor configured to act as a BigFET.

4. The apparatus of claim 1, the snapback supply clamp integrated with the amplifier.

5. The apparatus of claim 1, the trigger circuit integrated with the amplifier.

6. The apparatus of claim 1, the trigger circuit comprising a trigger transistor configured to turn on the output transistor in response to detecting the clamp voltage.

7. The apparatus of claim 6, the trigger circuit comprising a capacitor connected between the first supply and a first node, and a resistor connected between the second supply and the first node, the capacitor and resistor configured to provide a voltage at the first node in response to the clamp voltage.

8. The apparatus of claim 7, the trigger circuit comprising an inverter connected to the first node and configured to provide an inverter output that enables the trigger transistor in response to the voltage at the first node.

9. The apparatus of claim 1, the interface pad configured to output an audio signal to an off-chip speaker.

10. The apparatus of claim 9, the ESD event occurring at the interface pad.

11. The apparatus of claim 1, the ESD event comprising a contact event up to 8 KV or an air discharge event up to 15 KV.

12. The apparatus of claim 1, the first supply configured as a VDD supply and the second supply configured as a VSS supply.

13. An apparatus, comprising:
   means for amplifying including a means for outputting signals configured to output an amplified signal at an output that is coupled to an interface pad;
   means for maintaining a clamp voltage during an electrostatic discharge (ESD) event, the means for maintaining the clamp voltage coupled across first and second supplies of the means for amplifying; and means for triggering the means for outputting to provide a discharge path from the interface pad to the second supply in response to the clamp voltage.

14. The apparatus of claim 13, the means for amplifying comprises means for Class D power amplification.

15. The apparatus of claim 13, the means for maintaining integrated with the means for outputting.

16. The apparatus of claim 13, the means for triggering integrated with the means for outputting.

17. The apparatus of claim 13, the means for outputting configured to act as a BigFET.

18. The apparatus of claim 13, the means for triggering comprising:
   means for detecting the clamp voltage; and
   means for enabling the means for outputting to provide the discharge path when the clamp voltage is detected.

19. The apparatus of claim 13, the first supply configured as a VDD supply and the second supply configured as a VSS supply, the ESD event occurring at the interface pad.

20. The apparatus of claim 13, the ESD event comprising a contact event up to 8 KV or an air discharge event up to 15 KV.

* * * * *